United States Patent
Ford et al.

(10) Patent No.: US 8,585,873 B2
(45) Date of Patent: Nov. 19, 2013

(54) METHODS AND APPARATUS FOR SPUTTERING

(75) Inventors: Mark Ashley Ford, Bristol (GB); Rajkumar Jakkaraju, Gwent (GB)

(73) Assignee: Aviza Technology Limited, Newport, Gwent (GB)

( * ) Notice: Subject to any disclaimer, the term of this patent is extended or adjusted under 35 U.S.C. 154(b) by 1262 days.

(21) Appl. No.: 11/247,199

(22) Filed: Oct. 12, 2005

(65) Prior Publication Data

US 2006/0081458 A1 Apr. 20, 2006

Related U.S. Application Data

(60) Provisional application No. 60/619,712, filed on Oct. 19, 2004.

(30) Foreign Application Priority Data

Oct. 16, 2004 (GB) .................................. 0423032.2

(51) Int. Cl.
| | |
|---|---|
| C23C 14/00 | (2006.01) |
| C23C 14/32 | (2006.01) |
| C25B 9/00 | (2006.01) |
| C25B 11/00 | (2006.01) |
| C25B 13/00 | (2006.01) |

(52) U.S. Cl.
USPC ............ 204/192.13; 204/192.12; 204/298.16; 204/298.17; 204/298.21; 204/298.22

(58) Field of Classification Search
USPC ............ 204/192.12, 298.28, 192.13, 298.16, 204/298.17, 298.21, 298.22
See application file for complete search history.

(56) References Cited

U.S. PATENT DOCUMENTS

| | | | |
|---|---|---|---|
| 6,207,026 B1 * | 3/2001 | Crocker | .................... 204/192.12 |
| 2008/0023318 A1 | 1/2008 | Kuroiwa | |

FOREIGN PATENT DOCUMENTS

| | | | | |
|---|---|---|---|---|
| JP | 58144474 A | * | 8/1983 | |
| JP | 08144058 A | * | 6/1996 | |
| JP | 10195649 A | * | 7/1998 | |
| JP | 11144338 A | * | 5/1999 | |
| JP | 11-189873 | | 7/1999 | |

OTHER PUBLICATIONS

Japanese Machine Translation of JP 11144338.*
Japanese Machine Translation of JP 10195649.*
Machine Translation—JP08144058.*

* cited by examiner

*Primary Examiner* — Michael Band
(74) *Attorney, Agent, or Firm* — Volentine & Whitt, PLLC

(57) ABSTRACT

A method of sputtering with sputtering apparatus is for depositing a layer upon a substrate. The apparatus includes a sputter target with a face exposed to the substrate and a magnetron providing a magnetic field that moves relative to the target face. The speed of movement of the field is controlled such that the uniformity of the deposition on the substrate is enhanced. A particular method includes monitoring uniformity verses speed, selecting the speed that gives the preferred uniformity and controlling the field to the selected speed. The selected speed may vary over the life of the target, with increased speeds becoming desirable as the target thins.

11 Claims, 9 Drawing Sheets

Mean. 14941.2090(A)
STD Dev : 75.4257(A) (0.5048 %)
Min : 14598.8594(A)
Max : 15037.1018(A)
%Range : 2.9331
Center pos : (0.000, 0.000)mm
Size : 200.0000 mm

METHODS AND APPARATUS FOR SPUTTERING

CROSS REFERENCE TO RELATED APPLICATION

A claim to priority is made to U.S. Provisional Application Ser. No. 60/619712 filed Oct. 19, 2004 and British Patent Application No. 0423032.2 filed Oct. 16, 2004.

BACKGROUND OF THE INVENTION

1. Field of Invention

This invention relates to a method of sputtering with a sputtering apparatus for depositing a layer upon a substrate having a sputter target with a face exposed to substrate(s) and a magnetron providing a magnetic field that moves relative to the target face.

2. Description of Related Art

In most deposition processes that take place, for example in the formation of films on semiconductor wafers, one of the key manufacturing criteria is that there should be uniformity of deposited film thickness across the wafer. In particular for acoustic resonators, film thickness affects resonant frequency and therefore for all resonators upon a wafer to resonate at the same frequency, film thickness must be the same.

One of the key elements to achieve good uniformity of deposition upon a substrate from a closely spaced magnetron sputtering target assembly is the way in which the magnetic field moves with respect to the substrate (the alternative being large source-to-substrate distances approximating to a point source, but at the cost of low sputtering efficiency).

This may be achieved by moving the substrates past a static magnetron/target assembly. More recently, and particularly as substrate sizes have increased, the preference has been for the substrate to remain static and the magnetic field to move such as by physical rotation of the magnetron (or by suitable electrical switching causing the field of a fixed coil array to sweep across the face of the target). It is also known to move the field-creating element (e.g. a rotating magnet) laterally over a target and also to change target to magnetron spacing to improve uniformity of materials deposition thickness through target life (substrate to substrate repeatability). Whilst good results have been achieved using these techniques, and other techniques developed by the Applicants, lack of uniformity has still proved a significant problem in reactive sputtering processes.

It is important to recognise that it is the relative motion of magnetron to substrate that improves the deposition uniformity upon the substrate (by moving the point of erosion from the target—moving the source of sputtered material) not the motion of magnetron relative to the target—which achieves improved target consumption.

In the case of single wafer close coupled magnetron sputtering (as is commonplace in metallisation upon 100 mm-300 mm silicon wafers) there is generally a target little larger than the wafer (to minimise chamber size and target materials inventory) close coupled (to maximise efficiency of target utilisation) with a moving magnetron sweeping a magnetic field to gain uniformity of film deposition upon the substrate (and uniformity of target erosion).

SUMMARY OF THE INVENTION

From one aspect the invention consists in a method of sputtering with a sputtering apparatus having a sputter target and a magnetron for providing a field which moves relative to the target including controlling the speed of movement of the field such that the uniformity of deposition on the substrate is enhanced.

As will be demonstrated below, the Applicants have determined that, surprisingly, the rate at which the field passes across the target face affects the level of uniformity of deposition upon a substrate facing the target. Even more surprisingly, they have determined that a minimum in non-uniformity can be readily determined and better uniformity can be achieved by controlling the speed of rotation to that which produces a minimum. Put another way the speed can be selected to maximise the speed-enhanced uniformity.

The method may include the steps of (a) moving the field over a range of speeds; (b) monitoring uniformity versus speed; (c) selecting the speed that gives the preferred uniformity; and (d) controlling the field to the selected speed.

Steps (a) to (d) may be performed during the process and/or over the lifetime of the target and on single or many substrates). Preferably, as indicated above the selected speed is the one that gives the best uniformity and it may be determined by seeking a minimum in non-uniformity or a maximum uniformity.

Also as indicated above a magnetron may be physically fixed, but may provide a moving field, in which case it is the speed of the movement of the field that is selected.

The speed of rotation may lie between 20 and 500 rpm [approximately 0.33 to 8.33 Hz].

From another aspect the invention consists in a method of sputtering with sputtering apparatus having a sputter target and a magnetron for providing a field which moves relative to the target, including determining the rate of erosion of parts of the face of the target and scanning the magnetic field across the face of the target so that the erosion from all parts of the face of the target is at a substantially constant average rate.

In that case both the rate of erosion may be monitored (directly or indirectly e.g. by reference to film deposition uniformity) and the speed may be controlled in real time during the sputter process or a deposition process or from deposition to deposition through a target life.

In a particularly preferred embodiment the target is aluminium and the sputtering process is reactive sputtering and the deposited layer is aluminium nitride.

From a still further aspect the invention consists in sputtering apparatus having a sputter target and a magnetron for providing a field which moves relative to the target and a control for operating the apparatus in accordance with any of the methods defined above.

The target may be aluminium and the deposited layer may be aluminium nitride.

Although the invention has been defined above, it will be understood that it includes any inventive combination of the features set out above or in the following description.

BRIEF DESCRIPTION OF THE DRAWINGS

The invention may be performed in various ways and specific embodiments will now be described with reference to the accompanying drawings in which.

DETAILED DESCRIPTION OF PREFERRED EMBODIMENTS

Figure 7:
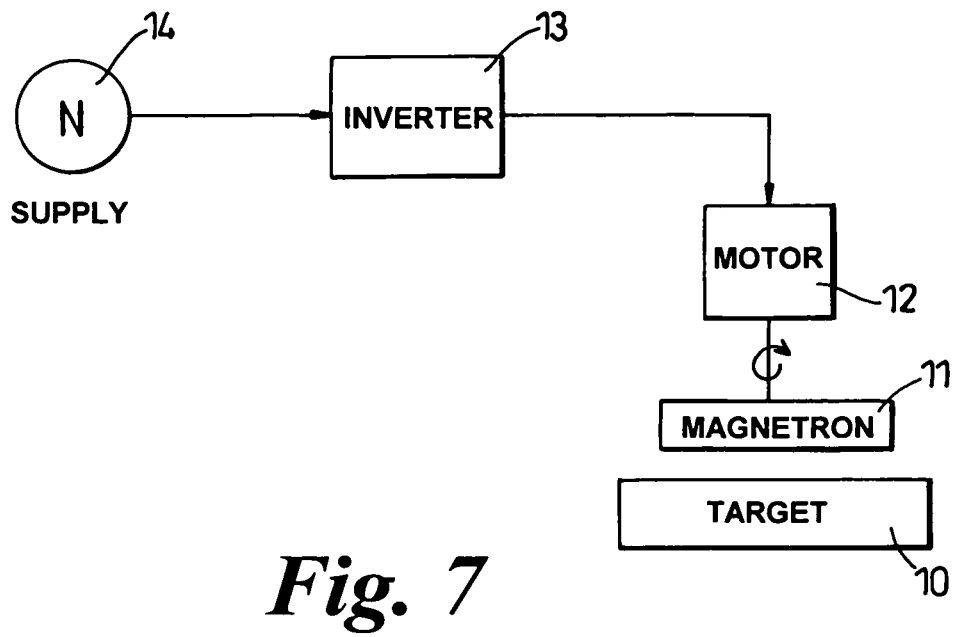
FIG. 7 is a schematic view of a basic speed control for sputter apparatus.

Referring first to FIG. 7, as is well-known, sputtering apparatus may include a target 10 having a rotatable magnetron 11 on its non-sputtering side. The magnetron may be rotated by a motor 12 or by other means such as a flow of cooling water impinging on an impeller.

In an embodiment of the inventive apparatus, an inverter 13 is supplied between the motor 12 and the supply 14 to allow control of the rotational speed of the motor 12.

Figure 1:
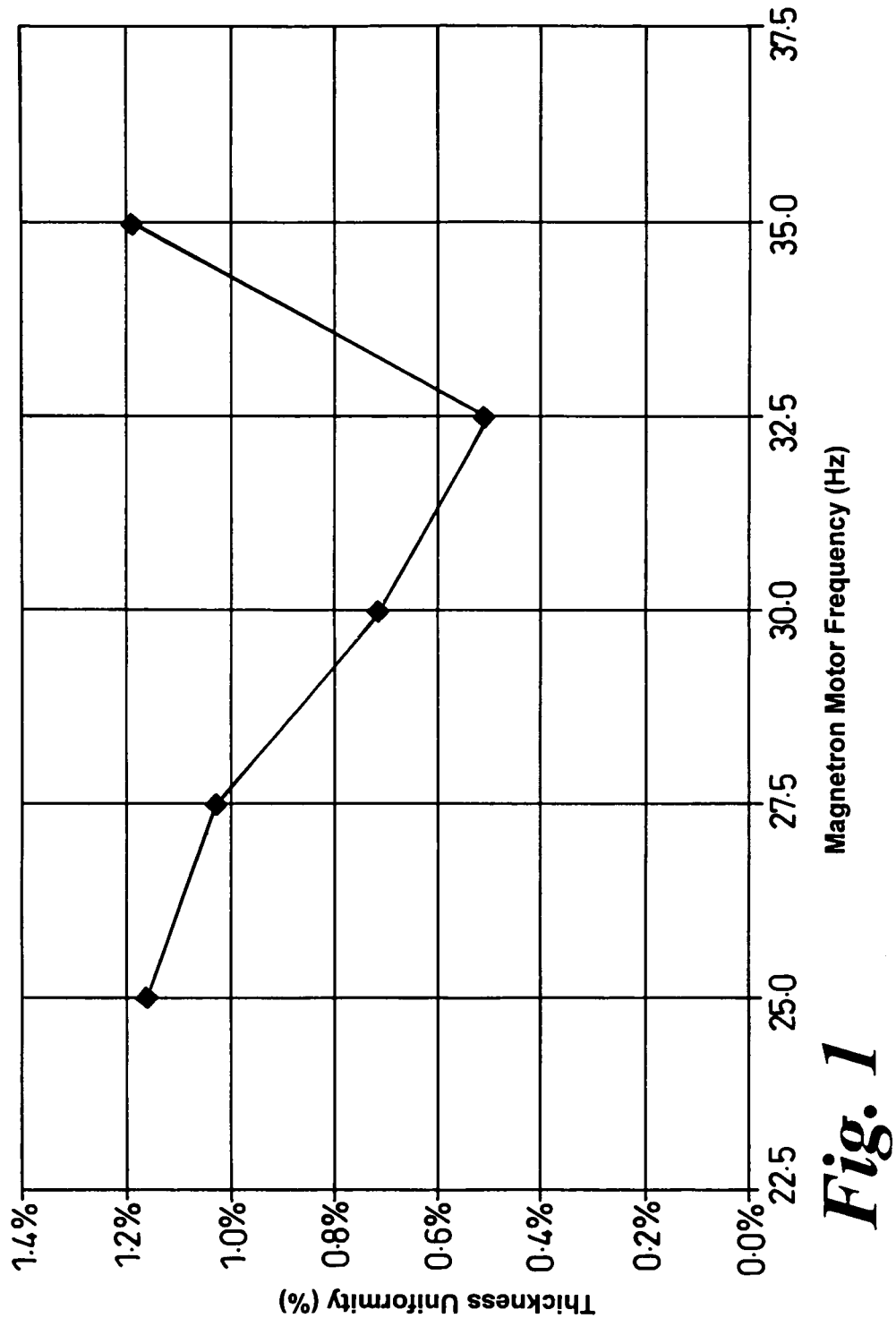
FIG. 1 is a plot of an indication of non-uniformity of deposition against magnetron rotating motor speed.
Figure 2:
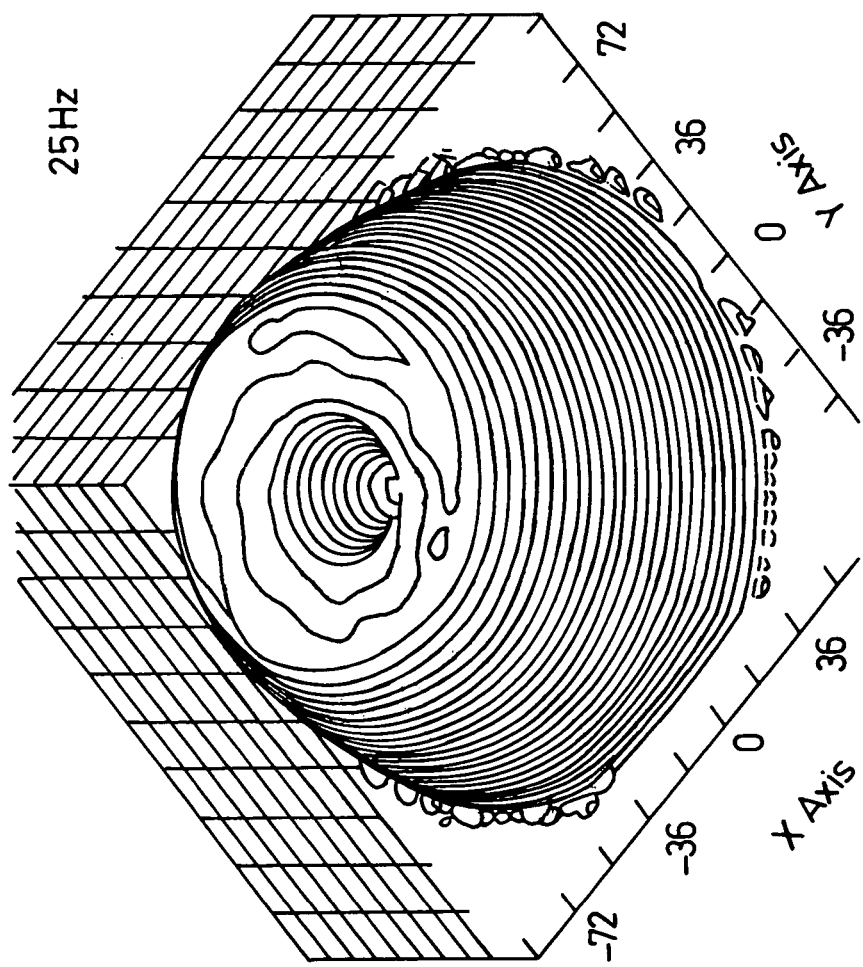
FIGS. 2 to 6 are plots of a cross wafer deposition characteristics for the various rotation speeds shown on the graph of FIG. 1.
Figure 3:
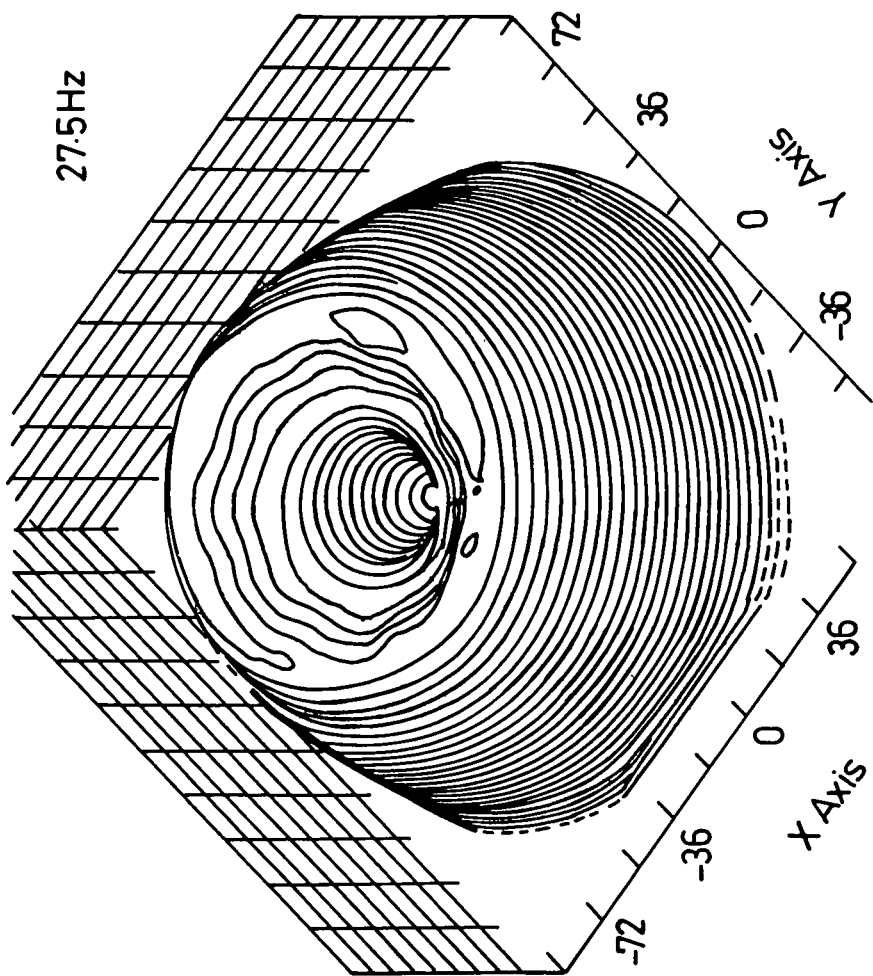
Figure 4:
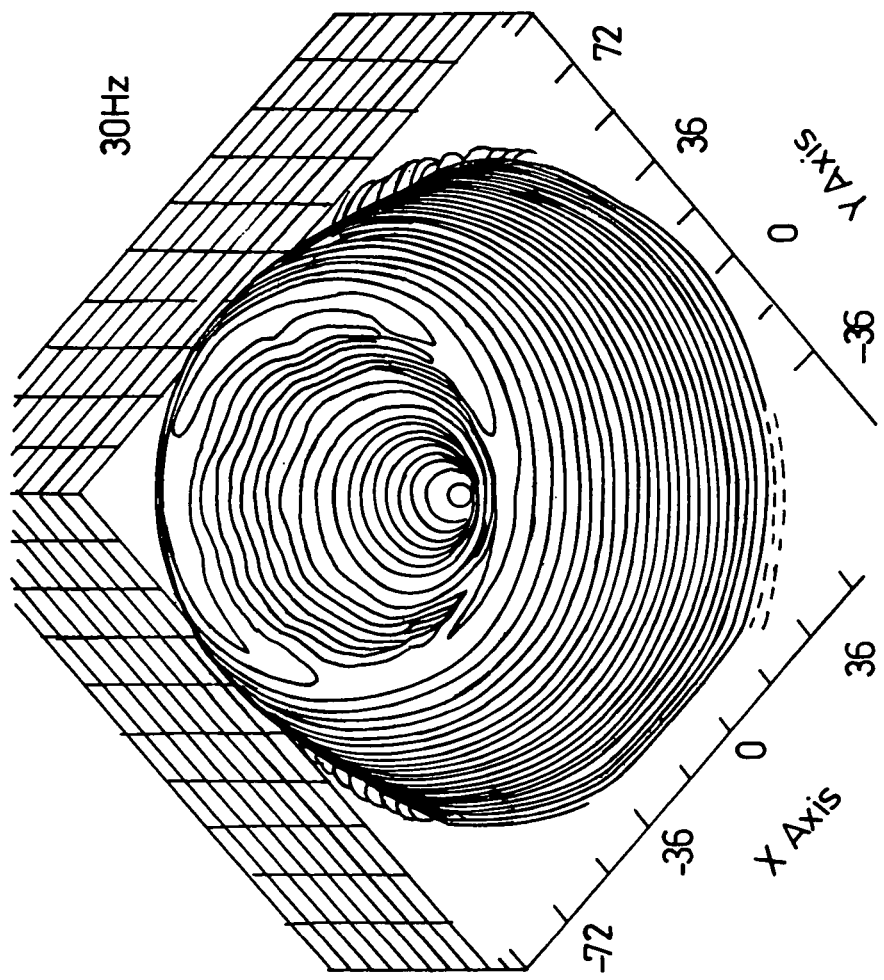
Figure 5:
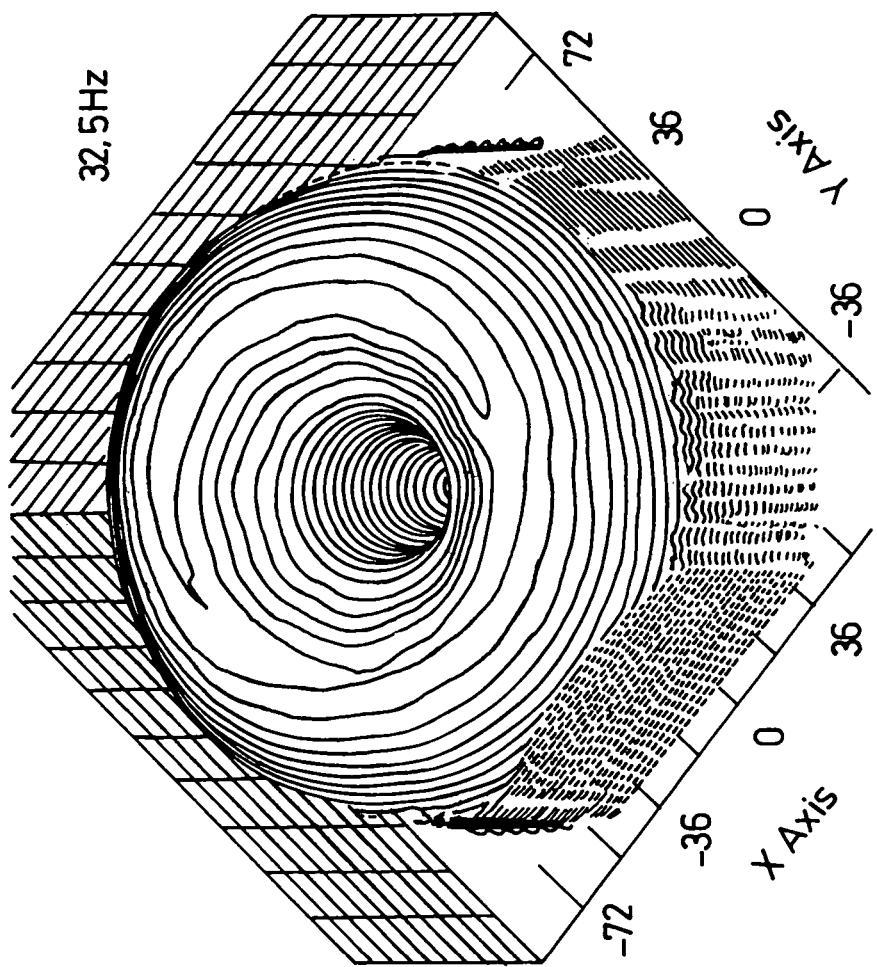
Figure 6:
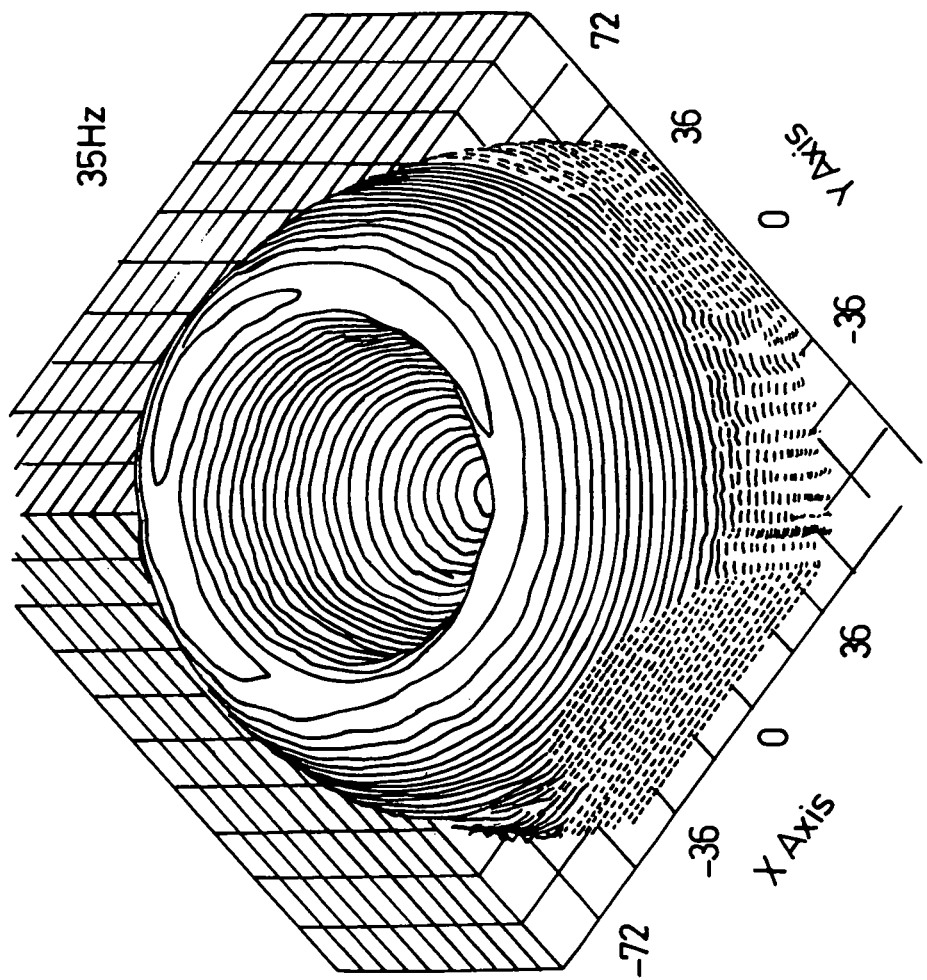

Using such apparatus the Applicants have processed a wafer under the following process conditions:
200 mm Wafer
target—aluminium
45 mm target to wafer spacing
Ar Gas Flow: 10 sccm
N2 Gas Flow: 50 sccm
Process pressure 2.2 millitorr
Platen Temperature: 400° C., no wafer clamping
Pulsed DC Target Power: 6 kW, Pulse frequency–100 kHz, Pulse width+4 µs
Platen Bias Power: 130 W of 13.56 MHz By using the inverter 13 to change the frequency of the supply to the magnetron motor 12, the speed of rotation of the magnetron 11 was varied and a plot, as shown in FIG. 1, was made of so-called thickness uniformity (%) against magnetron motor drive frequency where magnetron rpm is ten times inverter frequency such that 30 Hz equals 300 rpm of the magnetron. The thickness 'uniformity' figure is an industry standard expression (widely known as "1 sigma uniformity" in the semiconductor industry), though actually a measurement of non-uniformity being a standard deviation shown as a percentage of the mean. In essence the lower the value the greater the uniformity. As will be seen very clearly, not only did the thickness uniformity (%) vary with speed it reached a clear and discernable minimum at inverter frequency 32.5 Hz (which equates to 325 rpm or approximately 5.4 Hz of the magnetron) when the magnetron motor inverter was varied between 25 to 35 Hz.

The physical equivalence of these results can be clearly seen in FIGS. 2 to 6 and FIG. 5 shows the optimum or "minimum" value.

Using the FIG. 7 apparatus, it would be possible to preset the rotational speed or to vary it over time, as target erosion takes places, for example in accordance with a look-up table or algorithm as it has been found that the optimal rotational speed changes as the target is consumed.

Figure 8:
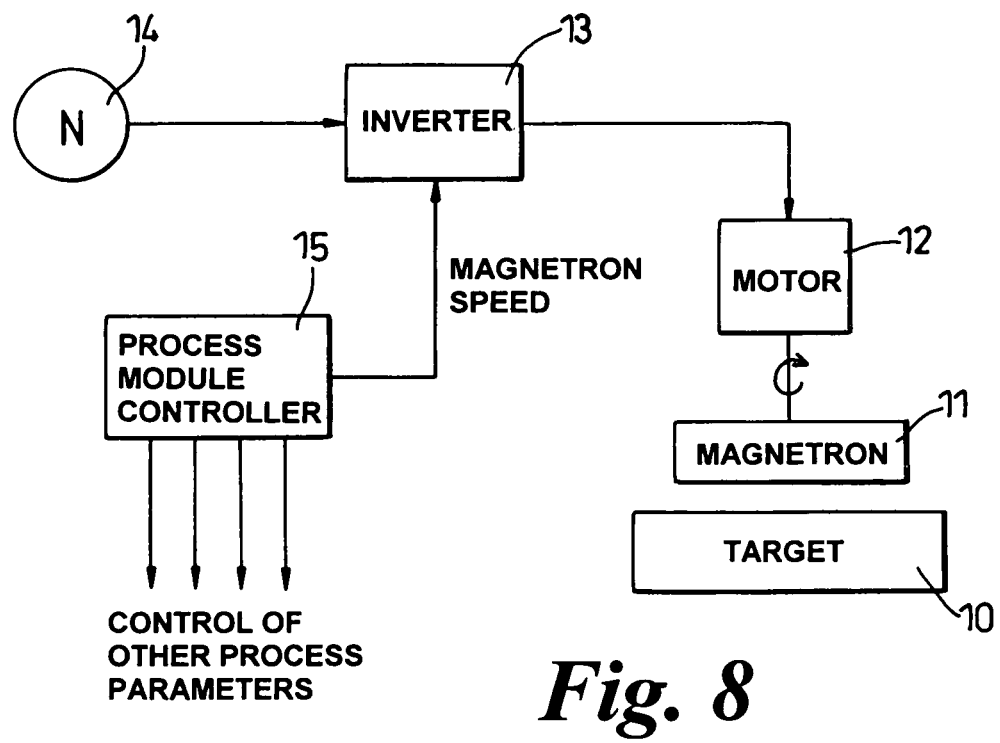
FIG. 8 shows a more sophisticated version of FIG. 7.

However, as indicated in FIG. 8, it would also be possible to vary this speed in real time using a process modular controller 15 to control the speed in accordance with a monitored parameter e.g. the thickness of deposition.

Figure 11:
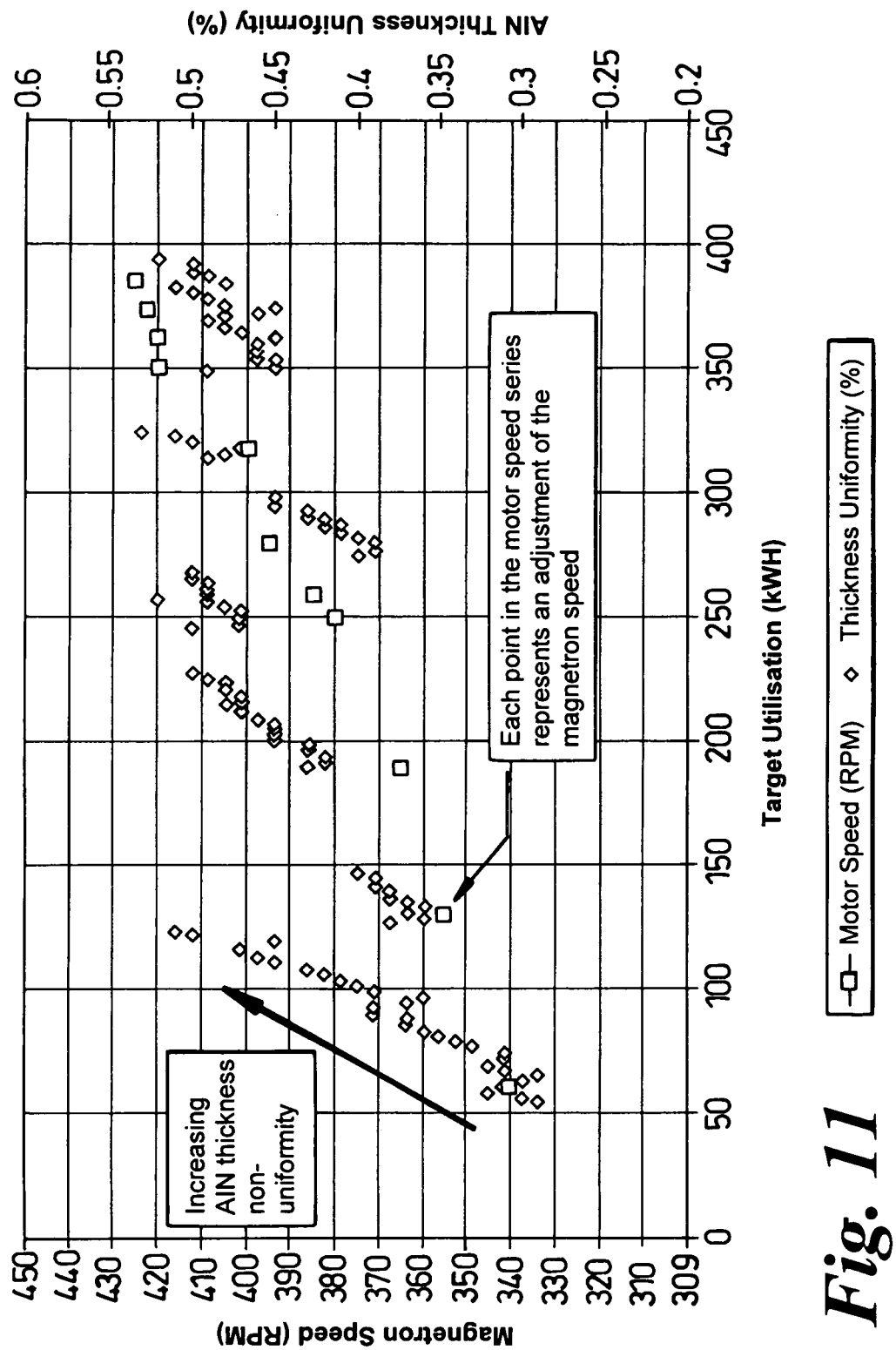
FIG. 11 is a plot of magnetron motor speed and uniformity against target utilisation.

When depositing Aluminium Nitride in a reactive sputtering process using an aluminium target, an improvement in uniformity of deposition through target life is achieved by increasing the magnetron speed as the target is consumed. An example of this is illustrated in FIG. 11. This plots Aluminium Nitride (AlN) non-uniformity of deposition on a substrate (expressed as "uniformity" as is conventional in the semiconductor and related fields) and magnetron speed in revolutions per minute (r.p.m.) through the usage of an aluminium target expressed in accumulated power consumption expressed in kilowatt hours (kWH) of usage.

As can be seen, as the target is consumed the uniformity worsens. Increasing the magnetron speed then brings the uniformity percentage down (improving uniformity). This example used a planar target with a total thickness (including backing plate) of 24 mm, with 1 mm spacing to a moving magnetron and 300 gauss field strength at the target face.

The uniformity of deposition through target life was further optimised by combining changes in magnetron offset as described in GB2386128B with changes in magnetron rotation speed. Improved uniformity for aluminium nitride deposition was achieved with a magnetron rotation speed of about 300 rpm for a fresh target and incrementally increasing the magnetron speed to 380 rpm at 250 kWH and about 420 rpm at about 350 kWH to about 500 rpm at accumulated power of 500 kWH. These particular values will be dependent on the thickness of the target and the rate of its consumption (material dependent).

The magnetron speed at any given target usage/thickness for best deposition uniformity can be established experimentally and the results used to establish a look-up table or an algorithm such as a $4^{th}$ order polynomial that can be used by a control program to adjust the magnetron speed throughout the target life.

Figure 9:
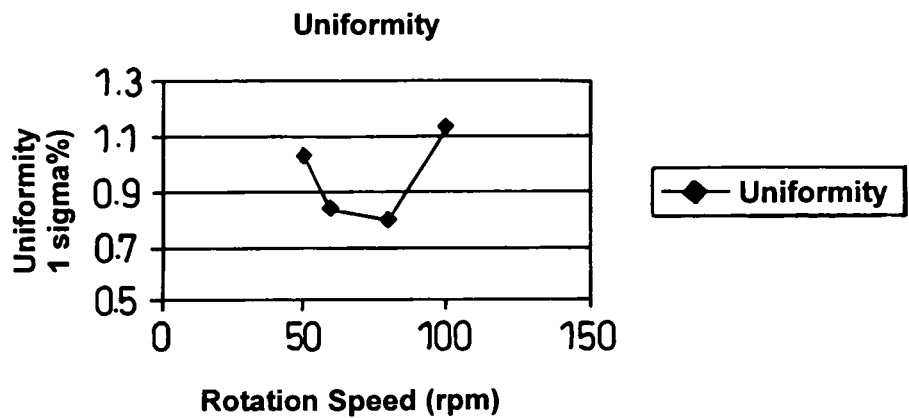
FIG. 9 is a plot of an indication of non-uniformity of deposition of molybdenum against magnetron speed.
Figure 10:
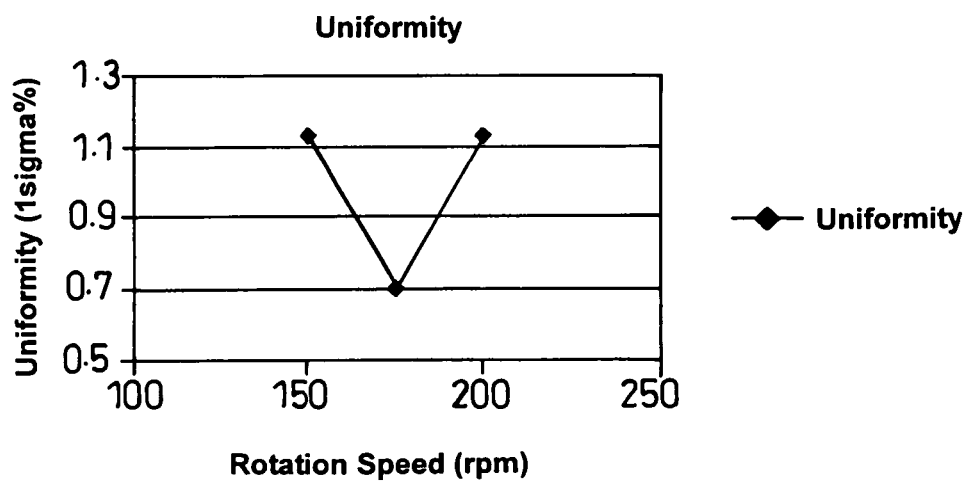
FIG. 10 is another plot of an indication of non-uniformity of deposition molybdenum against magnetron speed.

Further experiments have been performed for non-reactive sputtering (noble gas ambient) of molybdenum. As can be seen in FIGS. 9 and 10 minima are reached as magnetron rotation speeds were selected from 50 to 200 rpm (0.83 to 3.33 Hz) with the best uniformity at 175 rpm. As can be seen there are significant improvements. The change from 1.1% to 0.7% is a 36% improvement.

It should be understood that the improvements in uniformity from controlling the magnetron speed, whilst very significant for resonators and significant for gate, capacitor or barrier layers, are very small in absolute levels and may be masked by larger effects where uniformity is not already high.

Whilst molybdenum and aluminium nitride examples have been shown here there are many sputtering and reactive sputtering processes that may benefit from this invention, particularly where extremely good film thickness uniformity is requires, such as for resonators such as Film Bulk Acoustic Resonators (FBARs). Other example electrode, seed and resonant films are: Au, Ti, ZnO, Cr, NiCr, In, MoC, Zn, W, WSi, Cu, Pt and Si.

It is not yet fully understood why uniformity is improved by changing the frequency of magnetic sweep across the target face, though it provides an economical and easily implemented method of improving uniformity. It should be remembered that magnetron speed is in general fixed by mains supply frequency, water flow speed or other drive mechanism. It is not intuitively obvious to vary this speed and without the addition of a means of varying speed it is impossible to select a uniformity maximising speed. And, as has been demonstrated here, different processes and/or materials require different speeds for maximum uniformity—so no one fixed speed will give the best uniformity to a range of materials or processes.

Magnetron scanning speed may not necessarily be constant and the magnetron may dwell longer in some places than others, depending on their physical relationship, for example, to a gas inlet or pumping port.

Where the field is being moved around by selective switching of a fixed magnetic coil arrangement, the field may not need to pass continuously around the target face but may be move from sector to sector in accordance with reaction product creation rate.

Eddy currents will be set up in certain sputter targets by a moving magnetic field passing through it. These currents may offer an explanation as to why speed of movement of the magnetic field affects uniformity of target erosion. This also suggests that the optimum magnetic sweep speed may be a function of the magnetron field strength and shape at the target.

What is claimed is:

1. A method of sputtering comprising:
   correlating respective magnetic motor frequencies of a magnetron relative to a sputter target with respective deposition thickness uniformity percentages to which a material will be deposited uniformly in thickness on a substrate during a sputtering process by:
   (a) changing a magnetic motor frequency of the magnetron relative to the sputter target over a range of magnetic motor frequencies while carrying out a process of sputtering the sputter target; and
   (b) monitoring the uniformity of a result of the sputtering of the sputter target during the time the magnetic motor frequency is changed relative to the sputter target of the range of magnetic motor frequencies; and
   processing the substrate, using the magnetron, to deposit material on the substrate including by producing a magnetic field that moves relative to a surface of the sputter target, and
   controlling a rotational speed of the magnetron based on said correlating to regulate a speed of movement of the magnetic field relative to the sputter target such that a desired degree of uniformity of deposition thickness on the substrate is provided, and
   wherein the magnetron is situated behind the sputter target with respect to the sputter target being processed, and
   the controlling comprises changing the frequency at which the surface of the sputter target is swept by the magnetic field produced by the magnetron, and varying the power speed of movement of the magnetic field in accordance with the accumulated power of the sputter target.

2. A method as claimed in claim 1 wherein the rotational speed is controlled to maximise the uniformity of deposition across a surface of the substrate.

3. A method as claimed in claim 1 wherein steps (a) and (b) are performed in real time during the processing of the at least one substrate.

4. A method as claimed in claim 1 wherein steps (a) and (b) are performed over the lifetime of the target.

5. A method as claimed in claim 1 wherein the controlling comprises regulating the rotational speed to one which is associated with a minimum degree of non-uniformity of deposition or a maximum degree of uniformity of deposition in the correlation.

6. A method as claimed in claim 1 wherein the speed of movement lies between 0.33 Hz and 8.33 Hz.

7. A method as claimed in claim 1 wherein the target is aluminium and the processing of the at least one substrate comprises depositing a film of aluminium nitride on the substrate.

8. A method as claimed in claim 1 wherein the target is molybdenum.

9. A method as claimed in claim 1 wherein the controlling comprises increasing the speed of movement of the field during the operational lifetime of the target.

10. A method of sputtering comprising:
    correlating respective magnetic motor frequencies of a magnetron relative to a sputter target with respective deposition thickness uniformity percentages to which a material will be deposited uniformly in thickness on a substrate during a sputtering process; and
    processing at least one substrate, using the magnetron, to deposit material on the at least one substrate including by producing a magnetic field that scans a face of the sputter target, and
    controlling the magnetron based on said correlating to regulate a scanning speed of the magnetic field relative to the face of the sputter target such that a desired degree of uniformity of deposition thickness on the substrate is provided,
    wherein the magnetron is situated behind the sputter target with respect to the sputter target being processed,
    the correlating comprises:
    (a) changing a magnetic motor frequency of the magnetron relative to the sputter target over a range of magnetic motor frequencies while carrying out a process of sputtering the sputter target, and
    (b) monitoring the uniformity of a result of the sputtering of the sputter target during the time the magnetic motor frequency is changed relative to the sputter target, and
    steps (a) and (b) are performed in real time during the processing of the at least one substrate, and
    the controlling comprises varying the speed of movement of the magnetic field in accordance with accumulated power of the sputter target.

11. A method of sputtering comprising:
    correlating respective magnetic motor frequencies of a magnetron relative to a sputter target with respective deposition thickness uniformity percentages to which a material will be deposited uniformly in thickness on a substrate during a sputtering process; and
    processing at least one substrate, using the magnetron, to deposit material on the at least one substrate including by producing a magnetic field that scans a face of the sputter target, and
    controlling the magnetron based on said correlating to regulate a scanning speed of the magnetic field relative to the face of the sputter target such that a desired degree of uniformity of deposition thickness on the substrate is provided,
    wherein the magnetron is situated behind the sputter target with respect to the sputter target being processed,
    the correlating comprises:
    (a) changing a magnetic motor frequency of the magnetron relative to the sputter target over a range of magnetic motor frequencies while carrying out a process of sputtering the sputter target, and
    (b) monitoring the uniformity of a result of the sputtering of the sputter target during the time the magnetic motor frequency is changed relative to the sputter target, and
    steps (a) and (b) are performed over the lifetime of the target, and
    the controlling comprises varying the speed of movement of the magnetic field in accordance with the accumulated power of the sputter target.

* * * * *